United States Patent
Desurvire et al.

(10) Patent No.: US 10,404,303 B2
(45) Date of Patent: Sep. 3, 2019

(54) ANTENNA ADAPTER

(71) Applicant: THALES, Courbevoie (FR)

(72) Inventors: Emmanuel Desurvire, Palaiseau (FR); Jean-Paul Castera, Palaiseau (FR); Bertrand Demotes-Mainard, Neuilly-sur-Seine (FR)

(73) Assignee: THALES, Courbevoie (FR)

( * ) Notice: Subject to any disclaimer, the term of this patent is extended or adjusted under 35 U.S.C. 154(b) by 83 days.

(21) Appl. No.: 15/314,529

(22) PCT Filed: May 29, 2015

(86) PCT No.: PCT/EP2015/062040
§ 371 (c)(1),
(2) Date: Nov. 29, 2016

(87) PCT Pub. No.: WO2015/181382
PCT Pub. Date: Dec. 3, 2015

(65) Prior Publication Data
US 2017/0201283 A1    Jul. 13, 2017

(30) Foreign Application Priority Data

May 30, 2014  (FR) ..................................... 14 01253

(51) Int. Cl.
*H01Q 7/00*         (2006.01)
*H04B 1/18*         (2006.01)
(Continued)

(52) U.S. Cl.
CPC .............. *H04B 1/18* (2013.01); *G01R 15/20* (2013.01); *G01R 33/04* (2013.01); *H01Q 7/00* (2013.01); *H04B 1/52* (2013.01); *H04B 1/54* (2013.01)

(58) Field of Classification Search
CPC ....................................................... H04B 1/18
(Continued)

(56) References Cited

U.S. PATENT DOCUMENTS 5,285,155 A    2/1994  Ueda et al.
6,690,162 B1   2/2004  Schopohl et al.
(Continued)

FOREIGN PATENT DOCUMENTS

CN       1272920 A       11/2000
CN     101019005 A        8/2007
(Continued)

OTHER PUBLICATIONS

Preliminary Search Report dated Apr. 16, 2015 in related French Application No. FR 14 01253.
(Continued)

*Primary Examiner* — Graham P Smith
(74) *Attorney, Agent, or Firm* — Eric L. Lane; Green Patent Law

(57) ABSTRACT

This antenna adaptor (840) is intended to be placed between an antenna (830) and a receiving channel (850). It includes: a first conductive wire (806) crossed by an external current ($i_{ext}$) corresponding to a signal delivered at the output of the antenna, the first wire generating in its vicinity an external magnetic field; and a magnetometric sensor (810), placed in the vicinity of the first conductive wire, sensitive to a flow of the external magnetic field and able to generate an output signal corresponding to the external current.

9 Claims, 3 Drawing Sheets

(51) Int. Cl.
    *G01R 33/04*     (2006.01)
    *G01R 15/20*     (2006.01)
    *H04B 1/52*     (2015.01)
    *H04B 1/54*     (2006.01)

(58) Field of Classification Search
    USPC .......................................................... 343/906
    See application file for complete search history.

(56) References Cited

U.S. PATENT DOCUMENTS

2009/0224609 A1     9/2009   Cook et al.
2011/0065585 A1     3/2011   Lanting et al.

FOREIGN PATENT DOCUMENTS

| CN | 101504445 A | 8/2009 |
| CN | 102147482 A | 8/2011 |
| CN | 103777151 A | 5/2014 |
| EP | 1039307 A1 | 9/2000 |
| WO | WO 2007/024347 A2 | 3/2007 |

OTHER PUBLICATIONS

International Search Report dated Sep. 7, 2015 in related International Application No. PCT/EP2015/062040.
Written Opinion dated Jul. 9. 2015 in related International Application No. PCT/EP2015/062040.

ANTENNA ADAPTER

The invention is in the field of radiofrequency antenna systems and, more particularly adaptors of these systems, located between the antenna and the receiving circuit.

Generally, an adaptor is designed for operating within a limited band pass, centered on a predefined frequency f.

For this purpose, the adaptor includes a set or variable capacitor and/or inductor giving the possibility of operating in a resonator mode of the adaptor.

However, in certain applications, it is desirable that the antenna system be able to operate over a wide pass band. This is for example the case when the frequency of the incident electromagnetic wave on the antenna is unknown, when the frequency of the incident wave has variable frequency overtime, or even when the frequency of the incident wave is random.

For an operation on a wide pass band, the sensitivity of the antenna system is highly reduced due to the operating domain in the resonator mode of the adaptor.

Further, the frequency response of the antenna system is not uniform over the whole of the band pass.

A known solution consists of including a tunable filter (or band-switchable) between the antenna and the amplifier, the latter consisting of a plurality of circuits, each circuit being characterized by a particular band pass. The filter then allows the signal to be applied to the most suitable circuit as regards impedance and therefore sensitivity.

In addition to the need of including a tunable filter, which is a complex component, a defect of this approach lies in the insertion loss caused by adding the filter. This insertion loss increases the noise factor of the receiving channel of the antenna system.

Further, in principle, a tunable filter only gives the possibility of receiving a portion of the electromagnetic spectrum. Thus, this approach is not adapted to the case of an incident wave for which the frequency is unknown or random.

The object of the invention is therefore to overcome these problems.

The invention is notably relative to an antenna adapter having both an extended sensitivity range and a linear response.

For this purpose, the object of the invention is an antenna adaptor intended to be placed between an antenna and a receiving chain, characterized in that it includes: a first conductive wire in which flows an external current corresponding to a signal issued at the output of the antenna, the first wire generating in its vicinity, an external magnetic field; a magnetometric sensor placed in the vicinity of the first conductive wire, sensitive to a flux of the external magnetic field and able to generate an output signal corresponding to the external current.

The present adaptor operates over a very wide pass band. It has very high sensitivity, great dynamics, and a uniform frequency response.

According to particular embodiments, the adaptor includes one or several of the following features, taken individually or according to all the technically possible combinations:

the magnetometric sensor includes a magnetometer having an active surface and generating a response signal when it is immersed in a magnetic field generating a magnetic flux through the active surface; a control circuit, taking as an input the response signal of the magnetometer and generating at the output a feedback current; and a second conductive wire positioned in the vicinity of the magnetometer and connected at the output of the control circuit, the wire being crossed by the feedback current, the circuit and the conductive wire being such that a feedback magnetic field is generated, the flux of which through the active surface of the magnetometer substantially compensates, at each instant, the flux of the external magnetic field, the output of the antenna adaptor corresponding to the feedback current.

the magnetic sensor is a superconducting magnetic sensor.

the control circuit includes a comparison means able to compare the response signal of the magnetometer relatively to a reference signal and to generate a comparison signal, and a current source controlled by the comparison signal, able to generate the feedback current.

the adaptor has an extended pass band and a linear and uniform response on said pass band.

the magnetic sensor consists of a plurality of elementary magnetometers connected in series between two input terminals of the control circuit.

the first and the second conductive wires are conformed so as to progress in parallel in a plane of the surface of the magnetic sensor, the external current circulating in a first direction and the feedback current circulating in a second direction opposite to the first.

the first wire and/or the second wire form a loop around the surface of the magnetic sensor, the loop including at least one turn.

the magnetic sensor consisting of a plurality of elementary magnetic sensors connected in series between input terminals of the control circuit, the first and the second wire form a plurality of meanders around a plurality of elementary magnetic sensors.

as the elementary magnetic sensors are asymmetrical, the elementary magnetic sensors are positioned in one meander out of two, or, as said elementary magnetic sensors are symmetrical, the elementary magnetic sensors are positioned in each meander.

the magnetometric sensor and a portion of the first conductive wire are placed in a case allowing magnetic isolation from the outside world.

The invention and its advantages will be better understood upon reading the description which follows of embodiments and of methods for use, only given as an example, and made with reference to the appended drawings wherein.

Figure 1:
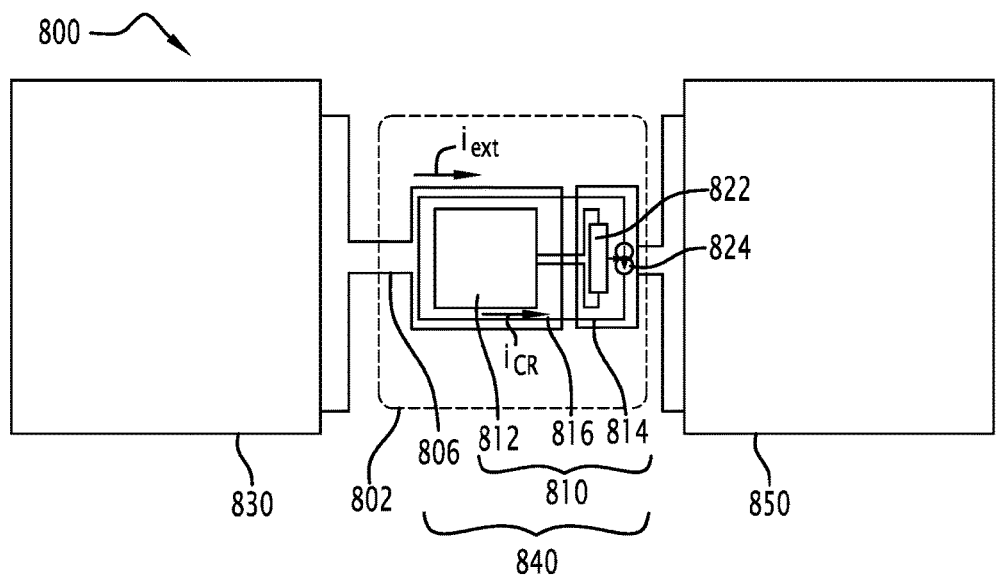
FIG. 1 is a basic illustration of an antenna adaptor applying the sensor of FIG. 1.

In FIG. 1 is illustrated an antenna system 800 including, successively connected: a dipolar or magnetic antenna 830; an antenna adaptor 840, used as an interface capable of matching the impedance between the antenna and the receiving channel; and a receiving channel 850, including a low-noise amplifier, a filter, a detector, a digitizer, and other signal processing components.

The antenna adaptor 840 includes a case 802 able to delimit a magnetically isolated area from the outside world and from magnetic perturbations, notably electromagnetic waves. The case 802 is in a suitable material able to screen these external fields.

The antenna adaptor 840 includes, inside the case 802, a first conductive wire 806 and a magnetometric sensor 810.

The first conductive wire 806 is connected to the antenna 830. It is crossed by the current delivered by the antenna 830, called an external current, $i_{ext}$. When the external current $i_{ext}$ circulates in the wire 806, it generates an external magnetic field $B_{ext}$ around the wire 806, in particular inside the case 802. The external field $B_{ext}$ is linear relatively to the external current $i_{ext}$. The external current $i_{ext}(t)$ varies over time t. The same also applies therefore to the external magnetic field $B_{ext}(t)$.

The magnetometric sensor 810 is able to measure the external magnetic field $B_{ext}(t)$ inside the case 802 in order to indirectly obtain a measurement of the current $i_{ext}(t)$.

The sensor 810 includes a magnetic sensor 812, a control circuit 814 and a second conductive wire 816.

A magnetic sensor 812 includes a component sensitive to the magnetic field, which is able to issue, as a voltage or as a current, a measurement signal V corresponding to the magnetic field in which it is immersed.

From among magnetic sensors, optical magnetic sensors are known, such as sensors with diamond N-V centres, wherein the transition between two energy levels of the electrons of an atom forming an impurity in a crystal is modified when this crystal is immersed in an external magnetic field $B_{ext}$. The modification of the transition modifies the response of the crystal illuminated with a suitable laser light. Such a magnetic sensor operates at room temperature.

The response of the crystal is linear but on a reduced frequency range around a characteristic frequency of the transition width used.

From among magnetic sensors, superconducting magnetic sensors are also known, which are of particular interest, since they provide the highest physically attainable sensitivities. Such a magnetic sensor, applying superconducting materials, operates at low temperatures (around about 80 K for so-called high critical temperature superconducting materials), or ultra-low temperatures, (around about one milli-Kelvin for so-called low critical temperature superconducting materials).

A superconducting magnetic sensor is a SQUID ("Superconducting Quantum Interference Device") component or a SQIF ("Superconducting Quantum Interference Filter") component. An SQIF component consist of a matrix of SQUID components, connected in series, in parallel or both.

Because of their operating principles, the SQUID and SQIF components have a non-linear response, i.e. the voltage $V(\phi)$ induced by the flux $\phi$ of the external magnetic field $B_{ext}$ crossing a surface S of the component, is not a linear function of the flux $\phi_{ext}$, and therefore of the external magnetic field $B_{ext}$.

In the case of a SQUID component, this response is a sine wave response. In the region of the inflection point of the sine wave, the behavior is linear to the first order. However, this region corresponds to a relatively narrow flux range.

In the case of an SQIF component, the response is uniform, $V(\phi)=este$, except around certain characteristic points, positioned periodically, for which the flux $\phi_{ext}$ of the external magnetic field $B_{ext}$ is equal to an integer number of times of a characteristic flux $\phi_0$, a so-called <<fluxon>>. Thus, the response of a SQIF component assumes the shape of a <<reversed comb>>.

In a modified SQIF component, having a particular configuration, the response is uniform except in a region around the origin, $\phi_{ext}=0$, where this response cancels out. In this region, the symmetrical response around the origin is quasi-linear. However, this region corresponds to a relatively narrow flux range.

The magnetic sensor 812 is a superconducting magnetic sensor.

The magnetic sensor 812 is of a rectangular parallelepipedal shape. It has a small thickness and an active surface S, substantially planar and having a normal in the direction of the thickness of the magnetic sensor.

The magnetic sensor 812 is able to generate, between both of its output terminals, a response signal, which here is a voltage V. The voltage V is a function of the instantaneous total magnetic flux $\phi(t)$ through the surface S.

The control circuit 814 receives between both of its input terminals, E1 and E2, the response signal $V(\phi(t))$ produced by the magnetic sensor 812, and generates a feedback current $i_{FB}(t)$ between both of its output terminals, S1 and S2.

The control circuit 814 applies a signal proportional to the feedback current to the receiving channel 850.

More specifically, the control circuit 814 includes a comparison means 822 connected to the input terminals E1 and E2, and able to compare the response signal $V(\phi(t))$ with a reference signal $V_0$ and to generate a comparison signal.

The control circuit 814 includes a current source 824 controlled by the comparison signal and able to generate, between two output terminals, the feedback current $i_{CR}(t)$.

The conductive wire 816 is connected between the output terminals S1 and S2 of the control circuit 814. It is conformed in order to circulate in the vicinity of the magnetic sensor 812. The conductive wire 816 is crossed by the feedback current $i_{CR}(t)$. Consequently, it generates around it a feedback magnetic field $B_{CR}(t)$. The field $B_{CR}(t)$ is linear relatively to the current $i_{CR}(t)$. The field $B_{CR}(t)$ generates a feedback flux $\phi_{CR}(t)$ through the surface S of the magnetic sensor 812: $\phi_{CR}(t)=B_{CR}(t)\cdot S$ At each instant, the response signal V(t) delivered by the magnetic sensor 812 depends on the total magnetic flux $\phi(t)$ crossing the surface S.

This total flux $\phi(t)$ is the sum of the external flux $\phi_{ext}(t)$, which results from the external magnetic field $B_{ext}(t)$ to be measured according to the relationship $\phi_{ext}(t)=B_{ext}(t)—S$, and from the feedback flux $\phi_{CR}(t)$.

The sensor 810 is in equilibrium when the total flux $\phi(t)$ received by the magnetic sensor 812 is constant. Under these conditions, permanently forced by the instantaneous feedback, the feedback current $i_{CR}(t)$ represents a linear measurement of the external magnetic field $B_{ext}(t)$ In order that this equilibrium exists, the geometrical and physical parameters of the sensor 810 are selected so that the feedback flux is opposed to the external flux and that the response V(t) of the magnetic sensor 812 may be instantaneously brought back to the reference voltage $V_0$. In other words, the control circuit 814 and the conductive wire 816 are such that a feedback magnetic field is generated, the flux of which through the active surface of the magnetic sensor substantially compensates, at each instant, the flux of the external magnetic field.

It should be noted that if the external magnetic field $B_{ext}$ has a DC component, the stabilization point will be the reference voltage $V_u$ shifted by a constant.

By suitably selecting the reference voltage $V_0$, the maximum sensitivity of the sensor 810 is obtained for the response area of the magnetic sensor 812 wherein the derivative $$\frac{\partial V}{\partial \phi}$$

is maximum. For superconductiong magnetic sensor of the SQUID type, this corresponds to the inflection point of the sine wave response. For a superconducting magnetic sensor of the modified SQIF type, this corresponds to the point of origin, optionally slightly shifted in order to avoid ambiguities on the sign of the field and therefore on that of the current due to the symmetrical response of such a magnetic sensor.

It should be emphasized that in the magnetometric sensor 810, the response signal of the magnetic sensor 812 is not considered as a measurement signal, but as a regulation signal of a feedback loop. This is the feedback signal which is the measurement signal.

Thus, the antenna adaptor has great sensitivity, a linear and uniform behavior over an extended pass band, by forcing operation of the magnetic sensor in the narrow region where it has great sensitivity and a linear behavior.

Advantageously, in order that the sensor has good sensitivity, because of the circular shape of the magnetic field lines around a wire crossed by a current, the first and second wires 806 and 816 are positioned in the plane P of the surface S of the magnetic sensor 812.

Further, in the case when the external current does not have any DC component and when the first and second wires 806 and 816 are located perfectly symmetrically around the magnetic sensor 812, the feedback current is at each instant, the exact counterpart of the external current to be measured: $i_{CR}(t)=i_{ext}(t)$ It is possible to introduce a current amplification factor, defined by:

$$G=[i_{CR}(t)]/[i_{ext}(t)],$$

by selecting geometry wherein the second wire 816 is placed at a distance x2 from the centre of the magnetic sensor 812 which is larger than the distance x1 at which the first wire 806 is placed from the centre of the magnetic sensor 812.

The role of the antenna adaptor 840 is extended to a role of a wide band signal converter. It restores the signal as a current, and not as a voltage.

The receiving channel 850 has a radiofrequency signal not subject to pre-filtering, whence its "wide-band" property.

The antenna adaptor 840 has a loop configuration.

The first wire 806 is conformed in order to form a first loop around the magnetic sensor 812. The latter then measures a flux $\phi_{ext}(t)$ induced by a current loop, rather than by a rectilinear conductive wire. By assuming a circular loop, a multiplicative factor equal to $\pi$ is thereby introduced relatively to a configuration in which both wires are rectilinear.

Further, by conforming the first wire 806 so that the first loop includes N1>1 turns, the external flux $\phi_{ext}(t)$ through the surface S is multiplied by a factor N1.

The introduction of these multiplicative factors gives the possibility of increasing the sensitivity of the adaptor.

The second wire 816 is also conformed in order to form a second loop including N2 turns.

With the first and second loops of the same diameter, an integer amplification factor G is obtained simply by selecting a configuration wherein N1 is equal to G and N2 to 1. More generally, an integer amplification factor G is simply obtained by selecting:

$$\frac{N2}{N1}=G.$$

This loop configuration has a wide-band response.

The pass band is limited at high frequencies mainly by an effect of radiative resistance, $R_{rad}$, which is proportional to $f^4$, wherein f is the frequency of the feedback current $i_{CR}$. The radiative resistance supersedes here another limitation which is due to the inductance of the loop formed by the wire 816, this inductance being proportional to f.

By reducing the dimensions of the circuit formed by the conductive wire 816, the radiative resistance $R_{rad}$ may be reduced so as to push forward at most the high threshold frequency of the sensor 810.

Another drawback is that the first loop induces a <<parasitic>> current $i_{ind}(t)$ in the second loop, according to the law:

$$Z, i_{ind}(t)=-e\frac{\partial \phi_{ext}(t)}{\partial t}$$

Wherein Z is the impedance of the second feedback loop.

Both of these loops thus behave like a current transformer, and $i_{ind}(t)$ represents a measurement of the external current $i_{ext}(t)$.

In order to utilize the property of the magnetic sensor, the control circuit 814 is then adapted for generating a feedback current such that:

$$i_{CR}(t)=2\cdot i_{ind}(t)$$

The feedback current is injected into the second wire so as to circulate in the direction opposite to that of the induced current.

This has the effect of exactly cancelling out (to within a constant) the total flux in the magnetic sensor 812 and therefore properly servo control the feedback current.

Figure 5:
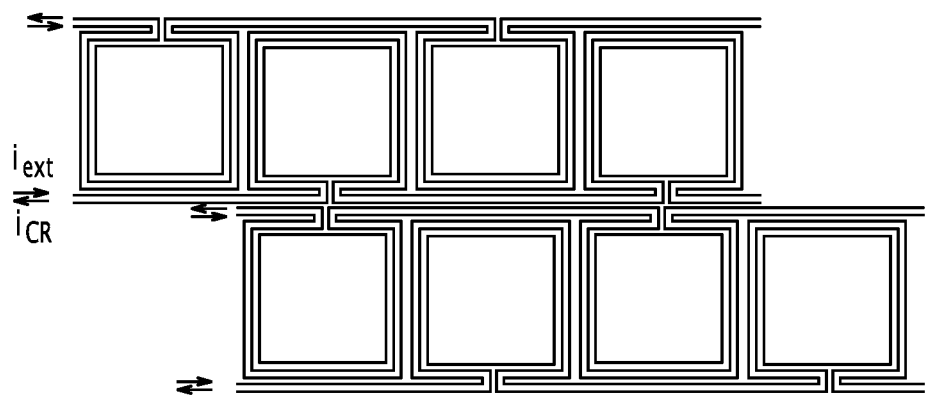
FIG. 5 is a simplified illustration of a dense two-dimensional integration of the so-called loop embodiments; and, FIG. 6 is a simplified illustration of a dense two-dimensional integration of so-called meander embodiments.

The loop configuration allows dense integration in one or two dimensions in the plane P, as this is schematically illustrated in FIG. 5.

This loop configuration gives the possibility of making a magnetic sensor with reduced dimensions.

Figure 2:
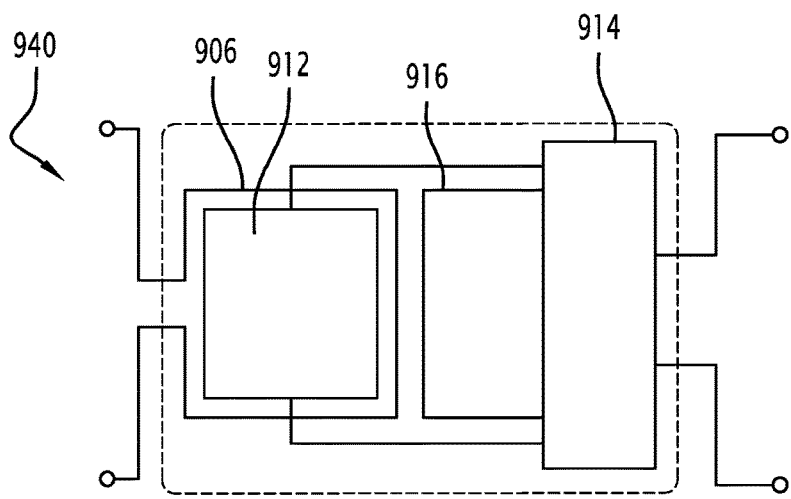
FIG. 2 is a schematic illustration of a so-called intermediate embodiment of the antenna adaptor of FIG. 9.

In FIG. 2, is illustrated an antenna adaptor 940 which forms an intermediate embodiment between the two loop configuration and the configuration with two rectilinear wires. An element of the adaptor of FIG. 2 either identical or similar to a corresponding element of the adaptor of FIG. 1 is located with the same reference number as this corresponding element increased by a hundred.

In this embodiment, if the first wire 906 is conformed in a first loop, the second wire 916 is rectilinear.

The advantage here is to allow removal of the induced parasitic current $i_{ind}(t)$ in the second wire by the first wire in the adaptor 840. The impedance of the magnetometric sensor 910 is thus strongly reduced, while retaining significant sensitivity because of the presence of the $\pi\cdot N1$ factor of the first loop relatively to the configuration where both wires are rectilinear (FIG. 1).

Another advantage of this intermediate configuration lies in the fact that in order to exactly compensate for the external flux, it is necessary to apply a feedback current which has a times greater intensity than the feedback current intensity of the antenna adaptor 840. Thus, the total gain on the feedback current, i.e. the measurement current, is here: $G=\pi^2 \cdot N1$, or for example $G=100$ for $N1=10$.

Figure 3:
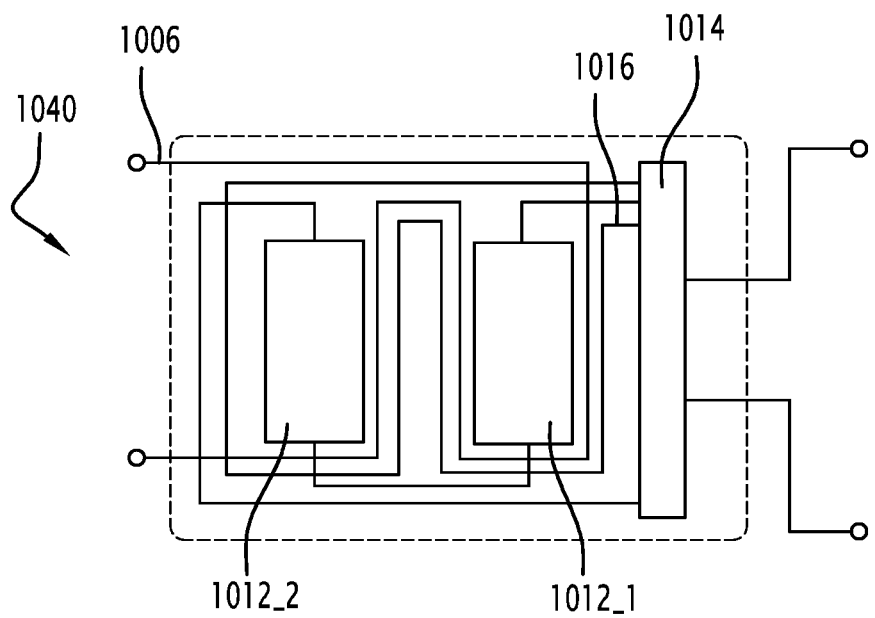
FIG. 3 is a schematic illustration of a so-called meander embodiment of the antenna adaptor of FIG. 9, applying asymmetrical magnetometers.
Figure 4:
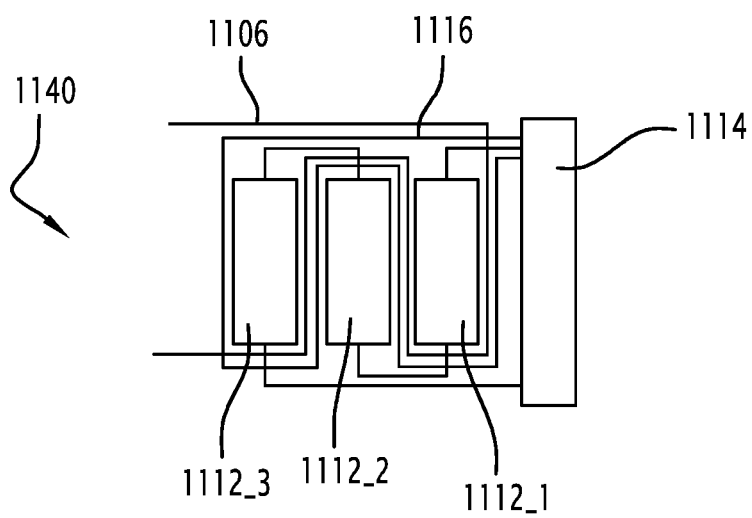
FIG. 4 is a schematic illustration of a so-called meander embodiment of the antenna adaptor of FIG. 9, applying symmetrical magnetometers.

FIGS. 3 and 4 illustrate two antenna adaptors according to a meander embodiment.

An element of the adaptor of FIG. 3 either identical or similar to an element corresponding to the adaptor of FIG. 1 is located with the same reference number as this corresponding element increased by two hundred.

In the antenna adaptor 1040, the magnetic sensor 1012 consists of a plurality of elementary magnetic sensors 1012-*i*, which are positioned along a row, so that their respective surfaces Si are in the same plane P. The elementary sensors 1012-*i* are connected in series between the input terminals E1 and E2 of the control circuit 1014.

The first and second wires 1006 and 1016 are conformed so as to progress parallel to each other in the plane P. They are separated from each other with a reduced pitch relatively to their respective widths.

The conductive wires 1006 and 1016 are configured so as to circulate between two elementary magnetic sensors 1012-*i* by forming a meander.

The external current $i_{ext}(t)$ is applied in the first wire 1006 in order to circulate in one direction and the feedback current $i_{CR}(t)$ is applied in the second wire 1016 so as to circulate in the other direction.

The magnetic field generated by a wire has, in the plane P of the surfaces Si of the elementary magnetic sensors, an orientation along the direction normal for the plane P, which is positive on one side of the wire and negative on the other side of the wire.

In the adaptor 1040, the elementary magnetic sensors 1012-*i* are asymmetrical, their response being such that: $V(-\phi)=-V(\phi)$. For example this is a SQUID. The elementary magnetic sensors 1012-*i* then have to be spaced apart of a meander out of two, in order that the responses of the elementary magnetic sensors do not cancel out two by two considering the inversion of the orientation of the external and feedback magnetic fields from one meander to the other.

An element of the adaptor of FIG. 4 either identical or similar to a corresponding element of the adaptor of FIG. 1 is located with the same reference number as this corresponding element, increased by three hundred.

In the adaptor 1140 of FIG. 4, everything being equal moreover with respect to the adaptor 1040 of FIG. 3, the elementary magnetic sensors 1112-*i* are symmetrical, their response being such that: $V(-\phi)=V(\phi)$. This is for example the case of superconducting magnetic sensors of the SQIF type. As their response is independent of the direction of the magnetic field, it is then advantageously possible to place elementary magnetic sensors 1112-*i* in each of the meanders defined by the first and second wires 1106 and 1116. The density of elementary magnetic sensors may thereby be increased, which, at constant surface gives the possibility of increasing the sensitivity of the antenna adaptor.

The meander configuration introduces a parasitic inductance and a radiative resistance, whence a limitation of the pass band. However, the meander configuration is characterized by an inductance and a radiative resistance which are intrinsically smaller than that of the loop configuration, which gives the possibility of further pushing forward the high cutoff frequency of the pass band of the antenna adaptor.

There again, by selecting very small dimensions for the circuit formed by the wire 1016 or 1116, the radiative resistance may be reduced so as to push forward at most the high cutoff frequency of the sensor.

Further, it is possible to optimize the geometrical parameters, for example the distance x between the second wire 1016, 1116 respectively, and the axis of the magnetic sensors 1012-*i*, 1112-*i* respectively, may be increased. The magnetic field generated by a wire decreasing by 1/x, in order to obtain the same feedback flux, it is then necessary to increase the feedback current. This has the advantage of allowing the detection of external magnetic fields of very low amplitude (along the normal to the surface Si of the magnetic sensors), i.e. of a low amplitude external current, by using the feedback current of high intensity.

Figure 6:
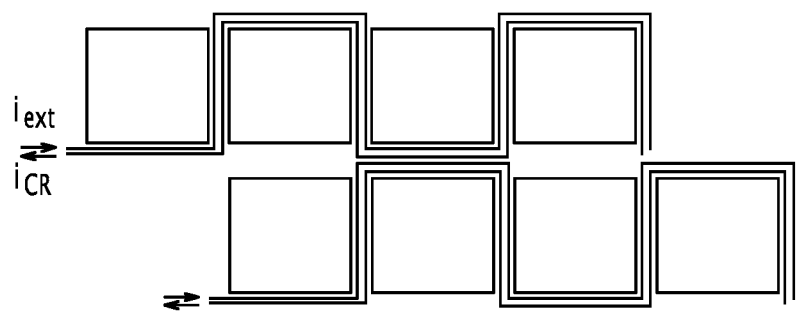

This meander configuration allows dense integration in one or two dimensions in the plane P, as this is schematically illustrated in FIG. 6.

This meander configuration gives the possibility of making an antenna adaptor with reduced dimensions.

The meander configuration is moreover more advantageous than the loop configuration since it is simpler to optimize it and to integrate it at a large scale.

Thus, the antenna adaptor according to the invention has a wide pass band on which, when the magnetic sensor is of the superconducting type, it has very high sensitivity. For a suitable design of the magnetometric sensor, it is possible to contemplate a band pass ranging from the very low frequency (VLF) to the ultra-high frequency (UHF), i.e. between about a few kHz and about 1,000 MHz.

The antenna adaptor also has an intrinsically linear response relatively to the intensity of the external current to be measured. Further, this response is uniform over the whole pass band, i.e. that it is independent of the frequency of the external current to be measured.

In terms of intensity of the measurable antenna current, the antenna adaptor may be adapted: segmentation into feedback current domains of the control circuit, optimized dimensioning of the loop/meander circuit of both conductive wires, multi-scale integration, etc.

Optionally, low-pass filters may be introduced into the control circuit, in order to give the possibility of specifying a certain number of frequency ranges for use, either by order of frequency quantity of the external current to be measured, or by frequency domains of interest.

The antenna adaptor finally provides the possibility of high-density planar integration and which may be dimensioned at a multi-centimeter scale.

The invention claimed is:

1. An antenna adaptor intended to be placed between an antenna and a receiving channel, wherein the antenna includes:
    a first conductive wire crossed by an external current corresponding to a signal delivered at an output of the antenna, the first conductive wire generating in a vicinity an external magnetic field;
    a magnetometric sensor placed in the vicinity of the first conductive wire, sensitive to a flux of the external magnetic field and generating an output signal corresponding to the external current;
    wherein the magnetometric sensor includes:
    a magnetometer having an active surface and generating a response signal when said magnetometer is immersed in a magnetic field generating a magnetic flux through the active surface;

a control circuit taking as an input the response signal of the magnetometer and generating at an output a feedback current;

a second conductive wire positioned in a vicinity of the magnetometer and connected at the output of the control circuit, the second conductive wire being crossed by the feedback current, the control circuit and the second conductive wire being such that a feedback magnetic field is generated, a flux of which through the active surface of the magnetometer substantially compensates, at each instant, for the flux of the external magnetic field; and an output signal of the antenna adaptor corresponding to the feedback current;

wherein the first and the second conductive wires are conformed so as to progress in parallel in a plane of the surface of the magnetometer, the external current circulating in a first direction and the feedback current circulating in a second direction opposite to the first direction; and wherein the magnetometer consists of a plurality of elementary magnetic sensors connected in series between input terminals of the control circuit, the first conductive wire and the second conductive wire forming a plurality of meanders around the plurality of elementary magnetic sensors.

2. The antenna adaptor according to claim 1, wherein the magnetometer is a superconducting magnetic sensor.

3. The antenna adaptor according to claim 1, wherein the control circuit includes a comparison module comparing the response signal of the magnetometer relatively to a reference signal and generating a comparison signal, and a current source controlled by the comparison signal, the current source generating the feedback current.

4. The antenna adaptor according to claim 1, having an extended pass band and a linear and uniform response on said pass band.

5. The antenna adaptor according to claim 1, wherein the magnetometer consists of a plurality of elementary magnetometers connected in series between two input terminals of the control circuit.

6. The antenna adaptor according to claim 1, wherein the first wire and/or the second conductive wire form a loop around the surface of the magnetometer, the loop including at least one turn.

7. The antenna adaptor according to claim 1, wherein, as said elementary magnetic sensors are asymmetrical, the elementary magnetic sensors are positioned in one meander out of two, or, as said elementary magnetic sensors are symmetrical, the elementary magnetic sensors are positioned in each meander.

8. The antenna adaptor according to claim 1, wherein the magnetometric sensor and a portion of the first conductive wire are placed in a case allowing a magnetic isolation towards the outside world.

9. An antenna adaptor intended to be placed between an antenna and a receiving channel, wherein the antenna includes:

a first conductive wire crossed by an external current corresponding to a signal delivered at an output of the antenna, the first conductive wire generating in a vicinity an external magnetic field;

a magnetometric sensor placed in the vicinity of the first conductive wire, sensitive to a flux of the external magnetic field and generating an output signal corresponding to the external current;

wherein the magnetometric sensor includes:

a magnetometer having an active surface and generating a response signal when said magnetometer is immersed in a magnetic field generating a magnetic flux through the active surface;

a control circuit taking as an input the response signal of the magnetometer and generating at an output a feedback current;

a second conductive wire positioned in a vicinity of the magnetometer and connected at the output of the control circuit, the second conductive wire being crossed by the feedback current, the control circuit and the second conductive wire being such that a feedback magnetic field is generated, a flux of which through the active surface of the magnetometer substantially compensates, at each instant, for the flux of the external magnetic field; and an output signal of the antenna adaptor corresponding to the feedback current;

wherein the first and the second conductive wires are conformed so as to progress in parallel in a plane of the surface of the magnetometer, the external current circulating in a first direction and the feedback current circulating in a second direction opposite to the first direction; and wherein, as said elementary magnetic sensors are asymmetrical, the elementary magnetic sensors are positioned in one meander out of two, or, as said elementary magnetic sensors are symmetrical, the elementary magnetic sensors are positioned in each meander.

* * * * *